(12) United States Patent
Mazzarella et al.

(10) Patent No.: US 11,933,648 B2
(45) Date of Patent: Mar. 19, 2024

(54) SENSOR OUTPUT DIGITIZER

(71) Applicant: INVENSENSE, INC., San Jose, CA (US)

(72) Inventors: Federico Mazzarella, Milan (IT); Massimiliano Musazzi, Como (IT)

(73) Assignee: INVENSENSE, INC., San Jose, CA (US)

( * ) Notice: Subject to any disclaimer, the term of this patent is extended or adjusted under 35 U.S.C. 154(b) by 417 days.

(21) Appl. No.: 17/345,778

(22) Filed: Jun. 11, 2021

(65) Prior Publication Data

US 2022/0333957 A1     Oct. 20, 2022

Related U.S. Application Data

(60) Provisional application No. 63/174,741, filed on Apr. 14, 2021.

(51) Int. Cl.
| | | |
|---|---|---|
| *H03M 1/00* | (2006.01) | |
| *B81B 7/02* | (2006.01) | |
| *G01D 9/32* | (2006.01) | |
| *H03M 1/14* | (2006.01) | |
| *H03M 1/16* | (2006.01) | |
| *H03M 1/46* | (2006.01) | |

(52) U.S. Cl.
CPC ............ *G01D 9/32* (2013.01); *B81B 7/02* (2013.01); *B81B 2201/02* (2013.01); *H03M 1/145* (2013.01); *H03M 1/16* (2013.01); *H03M 1/462* (2013.01); *H03M 1/466* (2013.01)

(58) Field of Classification Search
CPC ........ H03M 1/145; H03M 1/16; H03M 1/462; H03M 1/466; G01D 9/32; B81B 7/02
See application file for complete search history.

(56) References Cited

U.S. PATENT DOCUMENTS

| | | |
|---|---|---|
| 5,400,025 A | 5/1995 | Pfeiffer |
| 9,329,042 B1 | 5/2016 | Cazzaniga et al. |
| 10,103,742 B1 * | 10/2018 | Guo .................... H03M 1/145 |
| 2010/0132463 A1 | 6/2010 | Caminada et al. |
| 2014/0026061 A1 | 9/2014 | Shaeffer et al. |
| 2014/0260619 A1 | 9/2014 | Shaeffer et al. |
| 2019/0190535 A1 | 6/2019 | Tsinker |
| 2022/0333957 A1 | 10/2022 | Mazzarella et al. |
| 2023/0032538 A1 | 2/2023 | Pinna et al. |

OTHER PUBLICATIONS

Non-Final Office Action received for U.S. Appl. No. 17/680,637 dated May 26, 2023, 24 pages.

* cited by examiner

*Primary Examiner* — Joseph J Lauture
(74) *Attorney, Agent, or Firm* — Amin, Turocy & Watson, LLP

(57) ABSTRACT

The described technology is generally directed towards a sensor output digitizer. The sensor output digitizer can comprise a multiplexer stage, a multi-stage analog to digital converter, and a digital output combiner. The multiplexer stage can be configured to sequentially select sensor outputs from one or more sensors, resulting in a stream of selected sensor outputs. The multi-stage analog to digital converter can be coupled with the multiplexer stage, and can be configured to convert the stream of selected sensor outputs into a stream of digitized outputs. The digital output combiner can be configured to re-scale and sum intermediate outputs of the multi-stage analog to digital converter to produce a stream of digitized sensor outputs.

22 Claims, 7 Drawing Sheets

SENSOR OUTPUT DIGITIZER

PRIORITY CLAIM

This is a non-provisional patent application that claims priority to U.S. Provisional Patent Application Ser. No. 63/174,741, filed Apr. 14, 2021, entitled "ROUND-ROBIN SENSING CHANNEL WITH OPTIMAL FRONT END NOISE FILTERING AND HIGH LINEARITY INTEGRATING ADC," the entirety of which is incorporated herein by reference.

TECHNICAL FIELD

The subject disclosure generally relates to multi-channel sensors, more particularly, to electronics used to amplify and digitize outputs of multi-channel sensors.

BACKGROUND

Multi-channel sensing generally involves processing outputs of sensors that have multiple simultaneous outputs, or else, processing outputs of multiple different sensors that operate simultaneously. For example, micro electromechanical system (MEMS) sensors, which are used in many of today's electronic devices, can simultaneously detect motion in several different directions, e.g., motion along x, y, and z axes. An example MEMS sensor can include a suspended mass between pairs of capacitive plates. Each pair of capacitive plates is part of a respective sensing channel associated with a respective axis. When tilt or acceleration is applied to the MEMS sensor, the suspended mass creates differences in electric potential which can be measured in the different sensing channels.

Electronics for use in processing the multiple outputs of multi-channel sensors can be designed in several ways. In one example approach, separate hardware can be allocated for each sensing channel. In another approach, time domain division can allow sharing of hardware across multiple sensing channels. While providing dedicated hardware to each sensing channel leads to optimal performance and technical simplicity, sharing hardware across sensing channels can be more cost effective and can also produce acceptable performance.

Sharing hardware implies signal sampling, and so the design of shared hardware preferably puts particular care into how signals are band limited before sampling, with attention to limiting both out-of-band signals and noise. There is a need for improved shared hardware for use in processing multi-channel sensor outputs.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

One or more aspects of the technology described herein are generally directed towards a sensor output digitizer, and corresponding methods of use and manufacture. In some examples, a sensor output digitizer can comprise a multiplexer stage, a multi-stage analog to digital converter, and a digital output combiner. The multiplexer stage can be configured to sequentially select sensor outputs from one or more sensors, resulting in a stream of selected sensor outputs. The multi-stage analog to digital converter can be coupled with the multiplexer stage, and can be configured to convert the stream of selected sensor outputs into a stream of digitized outputs. The digital output combiner can be configured to re-scale and sum intermediate outputs of the multi-stage analog to digital converter to produce a stream of digitized sensor outputs. Further aspects and embodiments are described in detail below.

Figure 1:
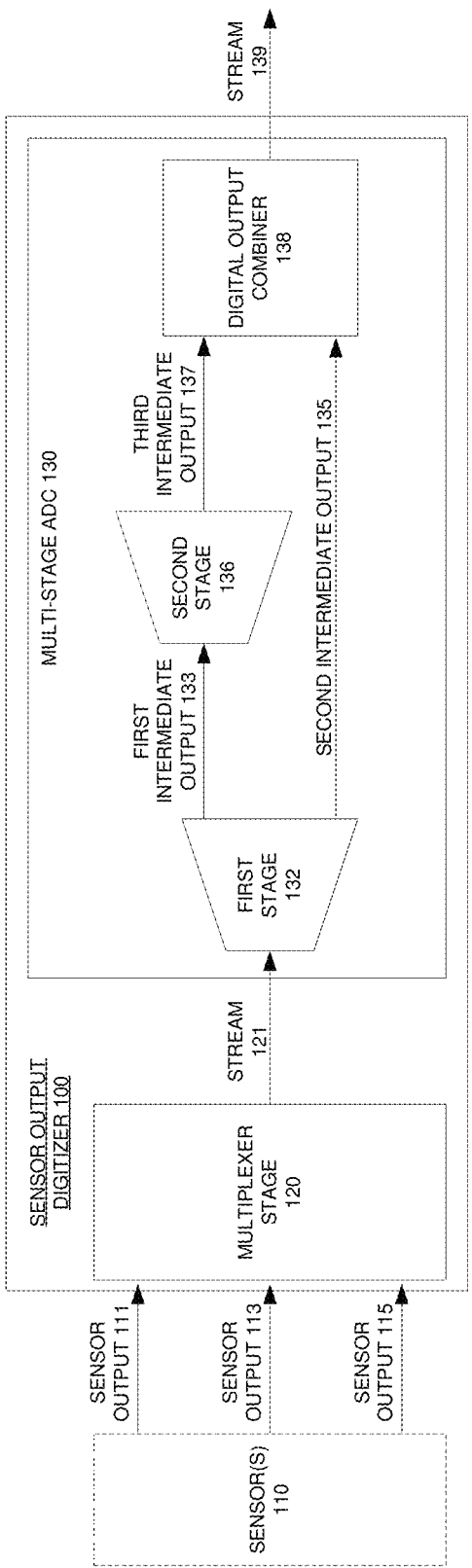
FIG. 1 illustrates an example sensor output digitizer, in accordance with various embodiments of this disclosure.

FIG. 1 illustrates an example sensor output digitizer 100, in accordance with various embodiments of this disclosure. The example sensor output digitizer 100 comprises a multiplexer stage 120, a multi-stage ADC 130, and a digital output combiner 138. In the illustrated embodiment, digital output combiner 138 is included within the multi-stage ADC 130. In general, the sensor output digitizer 100 can be configured to amplify and digitize sensor outputs 111, 113, 115 from one or more sensor(s) 110. In some embodiments, the sensor(s) 110 can comprise MEMS sensors, such as a multi-axis MEMS inertial sensor that detects acceleration on multiple different axes, and the sensor outputs 111, 113, 115 can each represent one the different axes.

The multiplexer stage 120 can be configured to sequentially select sensor outputs 111, 113, 115, from one or more sensors 110, resulting in a stream 121 of selected sensor outputs. In some embodiments, the multiplexer stage 120 can sequentially select sensor outputs 111, 113, 115 according to a round-robin selection sequence, e.g., by selecting sensor output 111, next selecting sensor output 113, next selecting sensor output 115, next returning to selecting the sensor output 111, followed by selecting sensor output 113, and so on thereafter in the round-robin selection sequence.

Figure 2:
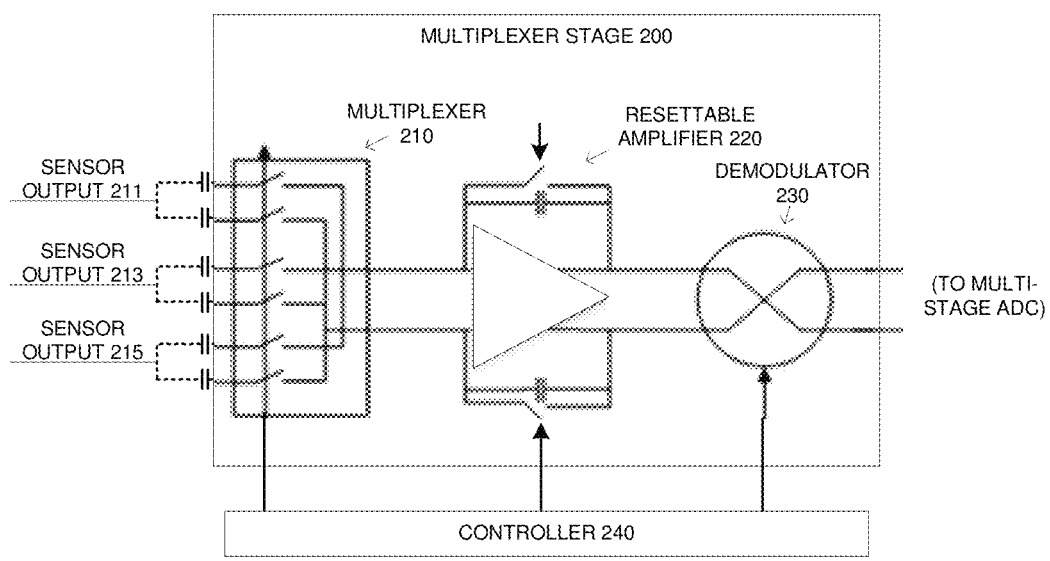
FIG. 2 illustrates an example multiplexer stage which can be included in a sensor output digitizer, in accordance with various embodiments of this disclosure.

In some embodiments, the multiplexer stage 120 can comprise a multiplexer that sequentially selects the sensor outputs 111, 113, 115, a resettable amplifier coupled with the multiplexer, wherein the resettable amplifier is configured to reset upon selection of a sensor output 111, 113, or 115, and a demodulator coupled between the resettable amplifier and the multi-stage ADC 130. FIG. 2 illustrates an example multiplexer stage including a multiplexer, a resettable amplifier, and a demodulator.

The multi-stage ADC 130 can be coupled with the multiplexer stage 120 and can be configured to convert the stream 121 of selected sensor outputs into a stream 139 of digitized outputs. The multi-stage ADC 130 can comprise a first stage 132, a second stage 136, and, optionally, the digital output combiner 138, along with various other components such as those illustrated in FIG. 3.

The first stage 132 can comprise, e.g., a sigma delta ADC. In some embodiments, the first stage 132 can comprise a first order sigma delta ADC. The first stage 132 can convert the stream 121 of selected sensor outputs into a first intermediate output 133 and a second intermediate output 135. The first intermediate output can comprise a residual voltage of the sigma delta ADC. The second intermediate output 135 can comprise a digital code that represents the most significant bits (MSBs) of the overall digital conversion performed by the multi-stage ADC 130.

The second stage 136 can comprise, e.g., a second ADC. In some embodiments, the second stage 136 can comprise an eleven bit successive approximation register (SAR) ADC. The second stage 136 can be coupled with the first intermediate output 133 and can convert the first intermediate output 133 into a third intermediate output 137 while the first stage 132 continues to convert the stream 121 of selected sensor outputs. The third intermediate output 137 can comprise a digital code that represent the least significant bits (LSBs) of the overall digital conversion performed by the multi-stage ADC 130.

The digital output combiner 138 can be configured to re-scale and sum the second intermediate output 135 and the third intermediate output 137 to produce the stream 139 of digitized sensor outputs. In general, the digital output combiner 138 can comprise a digital circuit that combines the MSBs of the second intermediate output 135 and the LSBs of the third intermediate output 137, with any appropriate scale factors, to produce the stream 139 of digitized sensor outputs. Operations of the digital output combiner 138 are discussed further in connection with FIG. 3.

Figure 3:
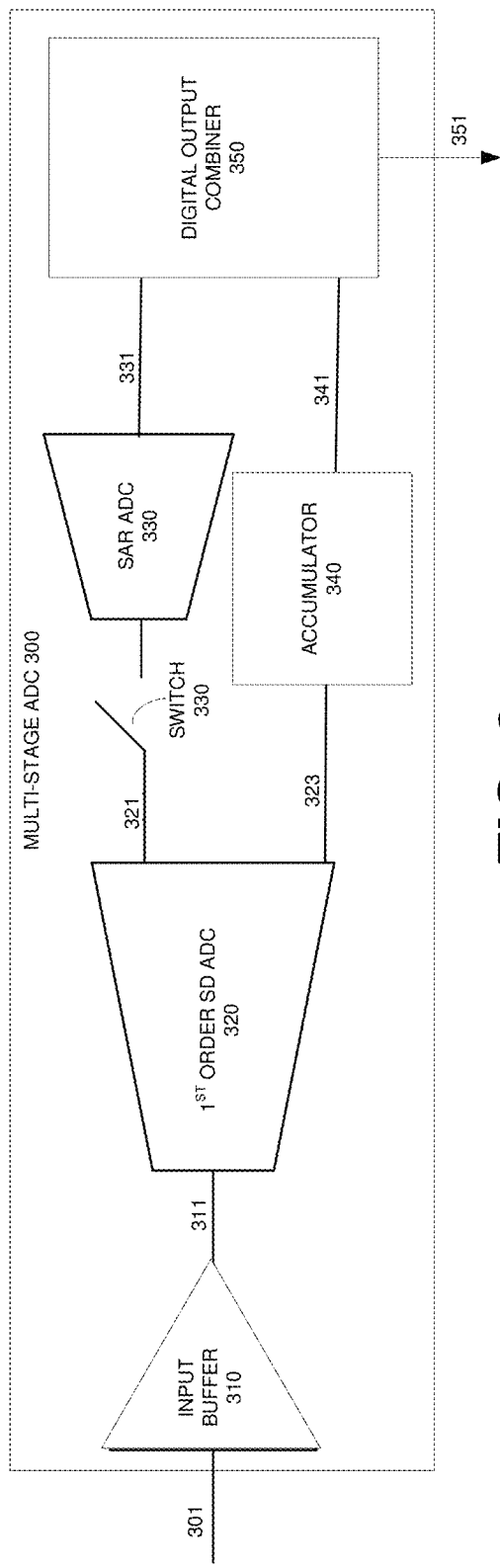
FIG. 3 illustrates an example multi-stage analog to digital converter (ADC) which can be included in a sensor output digitizer, in accordance with various embodiments of this disclosure.
Figure 4:
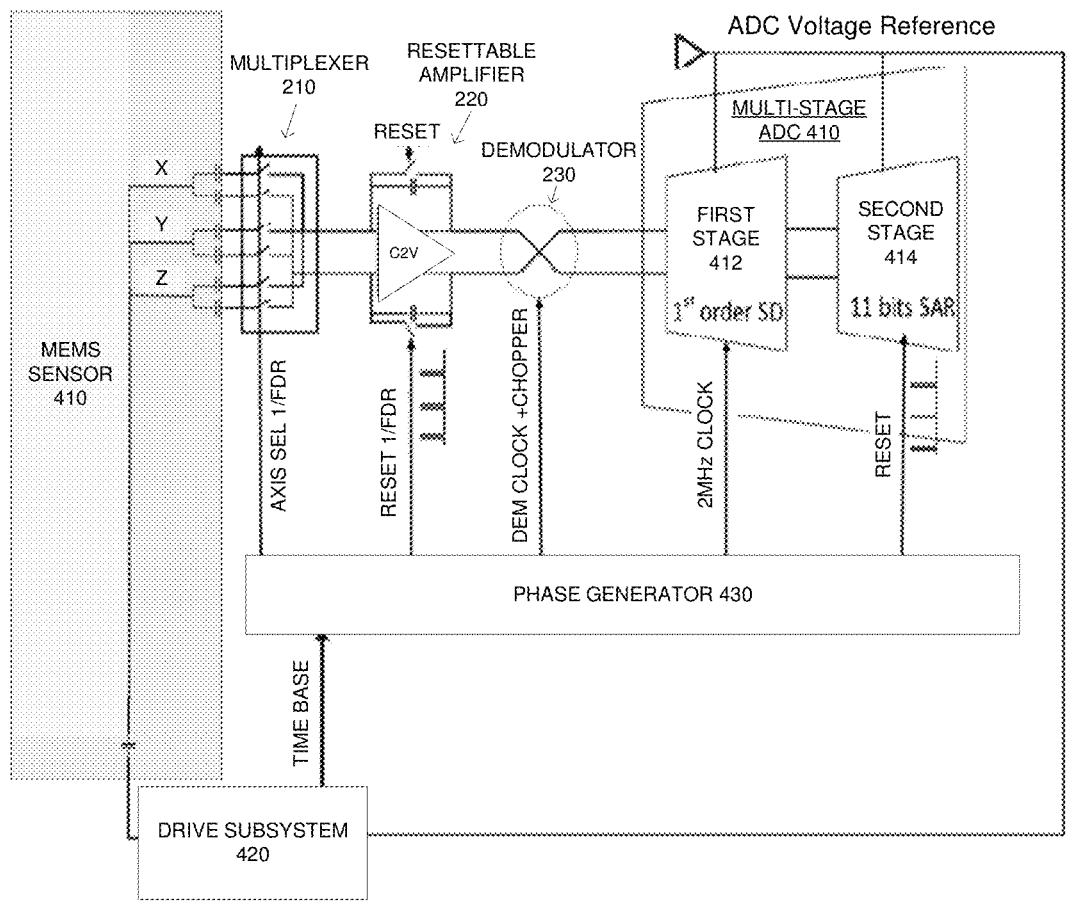
FIG. 4 illustrates components of an example sensor output digitizer coupled with control electronics, in accordance with various embodiments of this disclosure.

FIG. 3 illustrates various other components of an example multi-stage ADC 300, such as an accumulator 340 which can be optionally be coupled between the second intermediate output 135 from the first stage 132 and the digital output combiner 138. FIG. 3 is described in detail further below. FIG. 4 illustrates an example clocked drive circuit that can trigger sequential selection of sensor outputs by the multiplexer stage 120, as well as operations of various other components of the sensor output digitizer 100. FIG. 4 is described in detail further below.

FIG. 2 illustrates an example multiplexer stage 200 which can be included in a sensor output digitizer 100, in accordance with various embodiments of this disclosure. The example multiplexer stage 200 can implement the multiplexer stage 120 introduced in FIG. 1. The multiplexer stage 200 includes a multiplexer 210, a resettable amplifier 220, and a demodulator 230, wherein the multiplexer 210, resettable amplifier 220, and demodulator 230 are operated by a controller 240. In some embodiments, the controller 240 can be implemented by a drive system and a phase generator, as described with reference to FIG. 4.

The multiplexer 210 can include multiple switches coupled to sensor outputs 211, 213, 215. The multiplexer 210 can be configured to close switches associated with a selected sensor output 211, 213, or 215, while other switches are maintained in an open position. Signals from the controller 240 can trigger operation of the switches for sequential selection of the sensor outputs 211, 213, 215.

The resettable amplifier 220 can include an amplifier element and capacitor and switch elements, as shown. The controller 240 can be configured to activate the switches to reset the resettable amplifier 220. The controller 240 can time resets to occur substantially simultaneously, just before, or just after each sensor output selection at the multiplexer 210. For example, the controller 240 can trigger sensor output selections at the multiplexer 210 and resets of the resettable amplifier 220 at substantially simultaneous times.

The demodulator 230 can be configured to translate the signal received from the resettable amplifier 220 into baseband. The output of the demodulator 230 can comprise the stream 121 of selected sensor outputs, illustrated in FIG. 1.

FIG. 3 illustrates an example multi-stage analog to digital converter (ADC) 300 which can be included in a sensor output digitizer 100, in accordance with various embodiments of this disclosure. The example multi-stage ADC 300 can implement the multi-stage ADC 130 introduced in FIG. 1. The multi-stage ADC 300 includes an input buffer 310, a $1^{st}$ order sigma delta (SD) ADC 320, a switch 330, a SAR ADC 330, an accumulator 340, and a digital output combiner 350.

In FIG. 3, an input Vin(n) can be received at the input buffer 310 via 301. The $1^{st}$ order SD ADC 320 can produce an output x(n) via 321, and an output y(n) via 323. With Vin constant, the $1^{st}$ order SD ADC 320 can apply the below equation:

$$\frac{V_{in}}{V_{ref}} = \frac{C_{in}}{C_{int}}\left[\frac{1}{N}\frac{C_{int}}{C_{in}}\frac{x(NT)}{V_{ref}} + \frac{1}{N}\sum_{k=1}^{N}y(kT)\right]$$

The switch 330 can be operated such that n=N.
The SAR ADC 330 can produce the below output via 331:

$$\frac{x(N)}{V_{ref}}$$

The accumulator 340 can produce the below output via 341:

$$\sum_{k=1}^{N}y(k)$$

The digital output combiner 350 can produce the below output via 351:

$$\text{Out} = b * \left[a * \frac{x(N)}{V_{ref}} + \sum_{k=1}^{N}y(k)\right]5$$

We can then reconstruct Vin, if:

$$a = \frac{C_{int}}{C_{in}}, b = \frac{C_{int}}{C_{in}}\frac{1}{N}$$

FIG. 4 illustrates components of an example sensor output digitizer coupled with control electronics, in accordance with various embodiments of this disclosure. FIG. 4 illustrates a MEMS sensor 410 that produces three example sensor outputs, labeled X, Y, and Z. FIG. 4 furthermore provides sensor output digitizer components including the multiplexer 210, resettable amplifier 220, and demodulator 230 introduced in FIG. 2. The resettable amplifier 220 may also be referred to herein as C2V. The example sensor output digitizer components furthermore include an example multi-stage ADC 410 that can implement, e.g., the multi-stage ADC 130 illustrated in FIG. 1. The multi-stage ADC 410 includes a first stage 412 and a second stage, analogous to the first stage 132 and the second stage 136 introduced in FIG. 2. Finally, FIG. 4 illustrates a drive subsystem 420 and a phase generator 430 that can control the timing of operations by the various sensor output digitizer components.

In FIG. 4, the drive subsystem 420 can be configured to provide a time base to phase generator 430 and to generate a stimulus for the MEMS sensor 410. The phase generator 430 can be configured to provide various control signals to the various sensor output digitizer components. The phase generator 430 can provide an axis (i.e., sensor output) selection signal to the multiplexer 210, at a rate of once per drive frequency cycle. The phase generator 430 can provide a reset signal to the resettable amplifier 220, also at a rate of once per drive frequency cycle. The phase generator 430 can provide demodulator clock and chopper signal to the demodulator 230. The phase generator 430 can provide demodulator clock and chopper signal to the demodulator 230. The phase generator 430 can provide a clocked signal, e.g., a 2 Megahertz (MHz) clocked signal, to the first stage 412. The phase generator 430 can provide a reset signal to the second stage 414.

Figure 5:
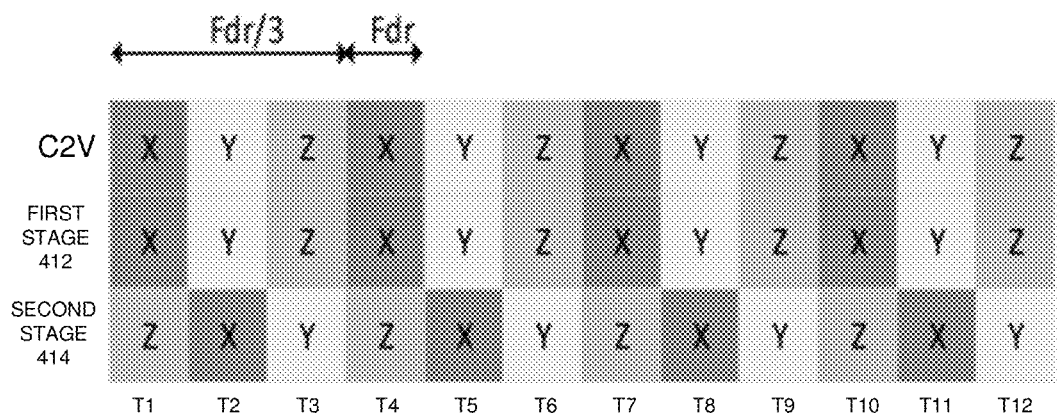
FIG. 5 illustrates an example round-robin read path including timing of operations associated with the various components of a sensor output digitizer, in accordance with various embodiments of this disclosure.

FIG. 5 illustrates an example round-robin read path including timing of operations associated with the various components of a sensor output digitizer, in accordance with various embodiments of this disclosure. FIG. 5 can be understood with reference to FIG. 4, as FIG. 5 shows timing of the processing of sensor outputs X, Y, and Z, by the components illustrated in FIG. 4, including the resettable amplifier (C2V) 220, the first stage 412, and the second stage 414. Columns in FIG. 5 represent actions by components at times T1, T2, T3 . . . T12, wherein the illustrated times are separated by time intervals established by the drive frequency (Fdr) applied by the phase generator 430. Thus, the time to process one round-robin cycle of X, Y, and Z can be established as ⅓ of Fdr.

At T1, C2V and the first stage 412 process sensor output X, while the second stage 414 processes a sensor output Z from a previous round robin cycle. At T2, C2V and the first stage 412 process sensor output Y, while the second stage 414 processes the sensor output X which was processed by C2V and the first stage 412 at T1. At T3, C2V and the first stage 412 process sensor output Z, while the second stage 414 processes the sensor output Y which was processed by C2V and the first stage 412 at T2. The round robin processing then repeats: at T4, C2V and the first stage 412 process a next sensor output X, while the second stage 414 processes a sensor output Z from the previous round robin cycle. The process can continue through time T12 and beyond.

Embodiments of this disclosure can implement a band limiting mechanism that simultaneously provides a coarse analog to digital conversion of input signals. Merging band limiting and analog to digital conversion, it is possible to loosen the requirements on analog to digital conversion steps, thus obtaining a linearity improvement. Embodiments can address the problem of designing a resettable sensing hardware that can be multiplexed across several sensor outputs and that minimizes noise folding from the front end amplifier while also achieving the high linearity appropriate for MEMS interfaces.

In some embodiments according to this disclosure, drive subsystem 420 can comprise a clocked drive circuit, at frequency fdrive (Fdr), that generates the appropriate stimulus for the MEMS sensor 410. The multiplexer 210 can select the sensor output to be decoded, wherein each sensor output can be modulated at frequency Fdr. The multiplexer 210 selection can change every Fdr cycle, and can rotate through all sensor outputs. The resettable amplifier 220 can amplify a modulated signal produced by the multiplexer 210. The demodulator 230, or multiplier, can translate the modulated signal back into baseband.

The first stage 412 can include a first ADC, such as a first order switched capacitor sigma delta ADC, which both integrates, with gain, and digitizes the signal produced by the demodulator 230 during an Fdr cycle. The outputs of first stage 412 can be a digital code that represents the MSBs of the overall digital conversion, and an analog residual, that represents the amplified quantization error of the first stage 412 conversion.

The second stage 414 can include a second ADC that is able to sample the analog residual output of the first stage 412, and proceed to convert the sampled output into digital code that represents the LSBs of the overall digital conversion. A digital output combiner, such as digital output combiner 138 in FIG. 1, can comprise a digital circuit that combines MSBs and LSBs with any appropriate scale factors.

The first stage 412 can provide integration of the signal on a 1/Fdr period, thus limiting the noise bandwidth of the incoming signal. In a MEMS sensor application, the dominant noise term can be the noise from the resettable amplifier 220. So, bandwidth limiting a signal before sampling can improve overall performance Note that a more complicated ADC (for example, a high order sigma delta), while feasible, may require a high order filter to limit the quantization noise and this may result in a larger folding for the input noise of the first stage 412 ADC.

The second stage 414 ADC can sample the amplified residual of the first stage 412, so the second stage 414 can comprise a relatively simple ADC, since its noise and non-idealities are reflected at the input divided by the first stage 412. The first and the second stages 412, 414 can operate in pipeline, so that, when the residual is being sampled by the second stage 414 ADC, the first stage 412 ADC can be switched to the next channel/sensor output.

The first stage 412 can comprise a switched capacitor first order sigma delta ADC. It is possible to use a continuous time sigma delta ADC at the first stage 412. It is also possible to adjust the number of bits of the sigma delta quantizer. The second stage 414 can comprise a capacitive SAR ADC. Some embodiments may use a different second stage 414 ADC, along with additional hardware to hold the signal for the second conversion.

In general, some embodiments according to this disclosure can use a first order extended range incremental ADC in a MEMS round robin sense channel. Embodiments can be smaller and simpler than other designs which include multiple integrators and more complex ADCs. Embodiments can furthermore provide a combination of sigma delta analog to digital conversion and optimal noise filtering of amplifier noise. Embodiments can furthermore provide good linearity, insured by a large gain preceding the second stage 414, which is the limiting element for linearity.

Further embodiments according to this disclosure can provide a round robin sensing path to amplify and digitize electrical signals coming from a sensor in a time window limited by the rotation of the hardware among the multiple axes that constitute the sensor. The fact that the amount of time is limited restricts the kind of filters that can be built to band limit the thermal noise from the sensor and from the electronic components. To optimize noise band limiting, it is desirable to use as much of the observation time as possible to average the signal, thus minimizing the cut off frequency of the filter.

Linearity in ADCs can be achieved by using sigma delta converters, which noise shape quantization noise and have strict requirements on the order of digital low pass filtering. Specifically, a digital filter of the same or higher order of the sigma delta converter is preferred to effectively reduce quantization noise level before secondary sampling. For round robin, a high order sigma delta (2nd order or more) can be used to reduce quantization noise enough in the allowable time window. However, high order filtering in a fixed time window implies higher cut off frequency. Hence, embodiments of this disclosure can include hardware that can provide filtering for noise (thermal and quantization), while still maintaining the high linearity requested by inertial sensors interfaces.

In an embodiment, the multiplexer 210 can select which axis is connected to the resettable amplifier 220 in each time frame. The resettable amplifier 220 can provide amplification of the signal modulated by the drive subsystem 420. The resettable amplifier 220's initial state can be reinstated at the beginning of each conversion cycle. The demodulator 230 can shift the signal to baseband.

The multi-stage ADC 410 can provide digitization, in accordance with a sequential selection scheme such as round robin. The first stage 412 can include a $1^{st}$ order sigma delta ADC and can calculate the MSBs. At the same time, the first stage 412 can provide a large signal gain, such that linearity and noise requirements for the following stages are relaxed. Being a $1^{st}$ order sigma delta, the digital reconstruction filter can be $1^{st}$ order, which can be optimal to limit the bandwidth of noise coming from the resettable amplifier 220. Quantization noise of the $1^{st}$ order SD ADC in the first stage 412 can be large.

The second stage 414 can include an 11 bit SAR ADC. The second stage 414 can sample and convert the residual voltage of the sigma delta integrator, reducing quantization noise to acceptable levels and calculating the LSBs of the conversion. SAR linearity can be limited by component matchings and preferably does not exceed ~10 bits without calibration. But the gain provided by the first stage 412 can be sufficient to reduce the linearity error to acceptable levels.

The second stage 414 need not necessarily include a SAR ADC. It is possible to implement the second discretization with different ADCs, such as integrating slope ADCs, sigma delta ADCs, or other ADCs, however some implementations may necessitate the addition of an analog holding stage.

In some embodiments, the number of MSBs (from the first stage 412) and LSBs (from the second stage 414) can be adjusted depending on available integration time and second stage 414 resolution. Also, integration time on the first stage 412 is not necessarily limited to one drive cycle: it can span across multiple cycles and can be extended to increase the gain of the first stage 412. For some sensors, e.g., gyroscopic sensors, a shorter time than a drive cycle is acceptable. For example, half a drive cycle can be used.

In a more complex implementation, it is possible to add a sampled low pass filter between the resettable amplifier 220 and the multi-stage ADC 410, to decouple the sampling frequencies of the resettable amplifier 220 and the multi-stage ADC 410.

Figure 6:
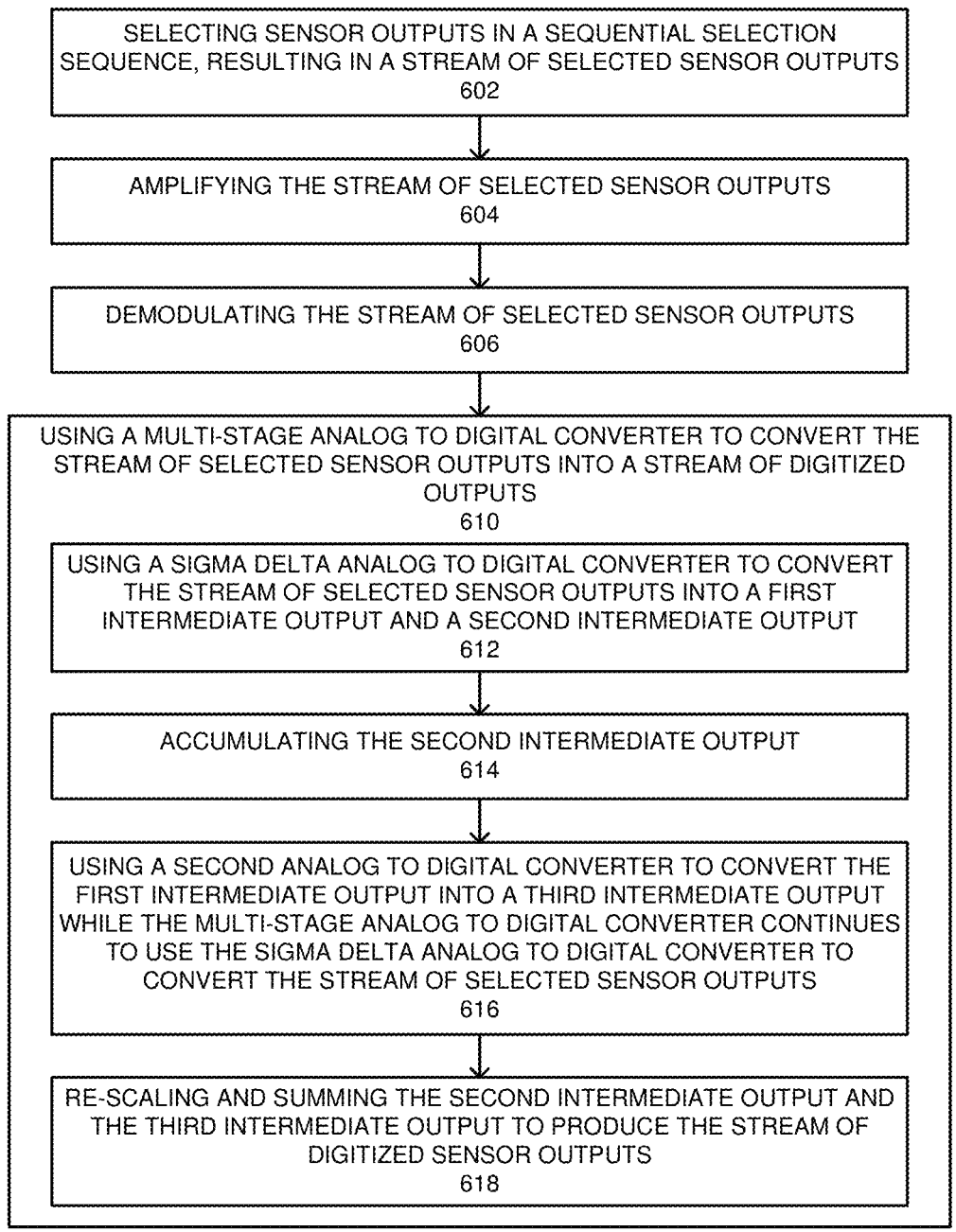
FIG. 6 illustrates an example sensor output digitizer method, in accordance with various embodiments of this disclosure.

FIG. 6 illustrates an example sensor output digitizer method, in accordance with various embodiments of this disclosure. For simplicity of explanation, the illustrated method is depicted and described as a series of acts. It is to be understood and appreciated that various embodiments disclosed herein need not be limited by the acts illustrated and/or by the order of acts. For example, acts can occur in various orders and/or concurrently, and with other acts not presented or described herein. Furthermore, not all illustrated acts may be required to implement methodologies in accordance with the disclosed subject matter. In addition, those skilled in the art will understand and appreciate that the methods illustrated herein could alternatively be represented as a series of interrelated states via a state diagram or events.

The operations illustrated in FIG. 6 can be performed, e.g., by a sensor output digitizer 100 such as illustrated in FIG. 1, wherein the multiplexer stage 120 can include elements of the multiplexer stage 200 illustrated in FIG. 2, and the multi-stage ADC 130 can include elements of the multi-stage AD 300 illustrated in FIG. 3.

Operations 602-606 can be performed by the multiplexer stage 120. At 602, the multiplexer 210 can select sensor outputs in a sequential selection sequence, resulting in a stream 121 of selected sensor outputs. One example sequential selection sequence is a round-robin selection sequence. The sensor outputs can comprise, e.g., outputs from a MEMS sensor such as MEMS sensor 410 in FIG. 4. Selection of sensor outputs can comprise triggering the selecting of sensor outputs in the sequential selection sequence using a clocked drive circuit, e.g., by phase generator 430 illustrated in FIG. 4. Various other operations illustrated in FIG. 6 can be triggered via a phase generator 430, as described in connection with FIG. 4.

At 604, the resettable amplifier 220 can amplify the stream 121 of selected sensor outputs prior to using the multi-stage analog to digital converter 130 to convert the stream 121 selected sensor outputs into the stream 139 of digitized outputs Amplifying the stream 121 of selected sensor outputs can comprise resetting, upon selection of a sensor output, the resettable amplifier 220 used to amplify the stream 121 of selected sensor outputs.

At 606, after amplifying the stream 121 of selected sensor outputs, the demodulator 230 can demodulate the stream 121 of selected sensor outputs prior to using the multi-stage analog to digital converter 130 to convert the stream 121 of selected sensor outputs into the stream 139 of digitized outputs.

At 610, the multi-stage analog to digital converter 130 can be used to convert the stream 121 of selected sensor outputs produced by the multiplexer stage 120 into a stream 139 of digitized outputs. Operation 610 can include operations 612-618.

At 612, a sigma delta analog to digital converter at the first stage 132, e.g., the $1^{st}$ order SD ADC 320 illustrated in FIG. 3, can be used to convert the stream 121 of selected sensor outputs into a first intermediate output 133 (illustrated as 321 in FIG. 3) and a second intermediate output 135 (illustrated as 323 in FIG. 3).

At 614, the accumulator 340 can accumulate the second intermediate output 135 (illustrated as 323 in FIG. 3) for use in re-scaling and summing the second intermediate output 135 and the third intermediate output 137 (illustrated as 331 in FIG. 3) to produce the stream 139 of digitized sensor outputs.

At 616, a second analog to digital converter at the second stage 136, e.g., the SAR ADC 330 illustrated in FIG. 3, can be used to convert the first intermediate output 133 into a third intermediate output 137 (illustrated as 331 in FIG. 3) while the multi-stage analog to digital converter 130 continues to use the sigma delta analog to digital converter 320 at the first stage 132 to convert the stream 121 of selected sensor outputs.

At 618, the digital output combiner 138 can re-scale and sum the second intermediate output 135 and the third intermediate output 137 to produce the stream 139 of digitized sensor outputs. While block 618 is illustrated within block 610, and similarly, digital output combiner 138 is illustrated within multi-stage ADC 130, embodiments that separate digital output combiner 138 from the multi-stage ADC 130 are also feasible. For example, the multi-stage ADC 130 can output the third intermediate output 137 and the second intermediate output 135 to a digital output combiner disposed outside of the multi-stage ADC 130, and such an outside digital output combiner can rescale and sum the third intermediate output 137 and the second intermediate output 135 to produce the stream 139 of digitized sensor outputs.

Figure 7A:
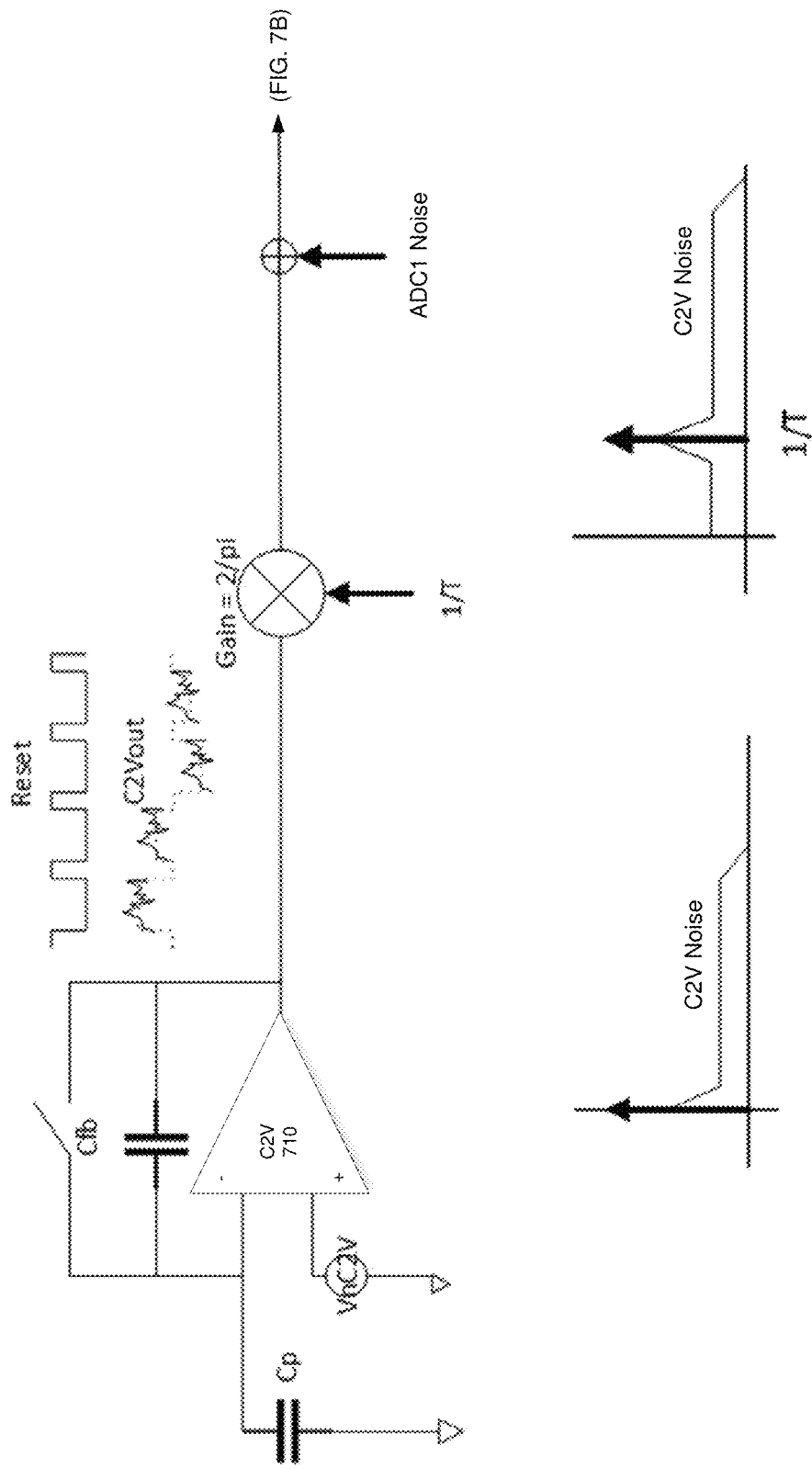
FIGS. 7A and 7B illustrate example noise propagation through a sensor output digitizer, in accordance with various embodiments of this disclosure.
Figure 7B:
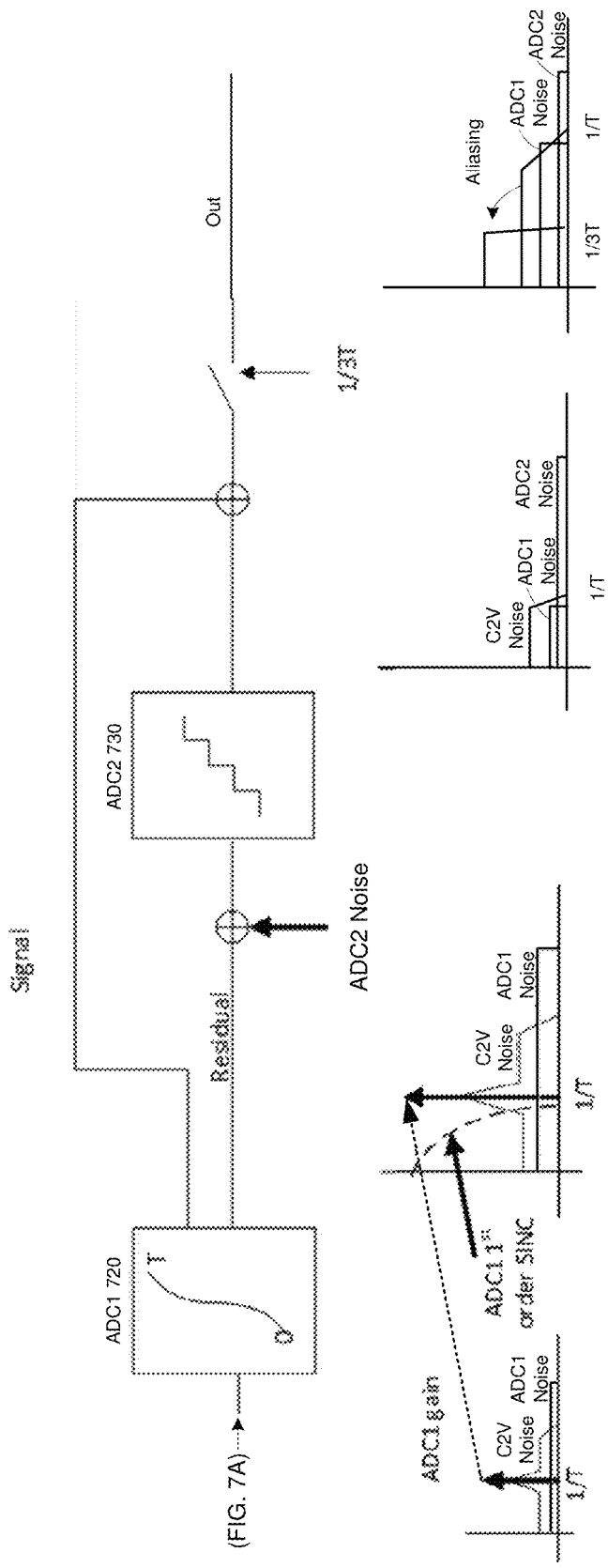

FIGS. 7A and 7B illustrate example noise propagation through a sensor output digitizer, in accordance with various embodiments of this disclosure. FIGS. 7A and 7B include a C2V 710, which can be included in a resettable amplifier 220 illustrated in FIG. 2, an ADC1 720, which can be included in a first stage 132 illustrated in FIG. 1, and an ADC2 730 which can be included in a second stage 136 illustrated in FIG. 1. Graphs along the bottom of FIGS. 7A and 7B illustrate noise as it propagates through the illustrated components. In general, ADC1 720 provides $1^{st}$ order integration, so that SC2V noise is filtered with $1^{st}$ order sinc of bandwidth 1/T (where T is acquisition time). In addition, ADC1 720 provides gain, so that input referred errors from ADC2 730 (noise and linearity) are minimized.

As employed in the subject specification, the term "component" refers to substantially any analog and/or digital based device(s), circuit(s), etc. comprising, e.g., a resistor, a capacitor, a transistor, a diode, an inductor, a memory, a programmable device, e.g., fuse, field programmable gate array (FPGA), complex programmable logic device (CPLD), etc. relevant to performing operations and/or functions of circuit(s), device(s), system(s), etc. disclosed herein. Further, the terms "processing component", "control unit component", "control unit", and "arithmetic logic unit (ALU)" can refer to substantially any computing processing unit or device (e.g., MAC, etc.), comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an ASIC, a digital signal processor (DSP), an FPGA, a programmable logic controller (PLC), a CPLD, a discrete gate or transistor logic, discrete hardware components, an analog circuit, or any combination thereof designed to perform the functions and/or processes described herein. Further, a processor can exploit nano-scale architectures such as, but not limited to, molecular and quantum-dot based transistors, switches and gates, e.g., in order to optimize space usage or enhance performance of mobile devices. A processor can also be implemented as a combination of computing processing units, devices, etc.

In the subject specification, the term "memory", "memory component", "lookup table (LUT)" and substantially any other information storage component relevant to operation and functionality of devices disclosed herein refer to "memory components," or entities embodied in a "memory," or components comprising the memory. It will be appreciated that the memory can include volatile memory and/or nonvolatile memory. By way of illustration, and not limitation, volatile memory, can include random access memory (RAM), which can act as external cache memory. By way of illustration and not limitation, RAM can include synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and/or Rambus dynamic RAM (RDRAM). In other embodiment(s) nonvolatile memory can include read only memory (ROM), programmable ROM (PROM), electrically programmable ROM (EPROM), electrically erasable ROM (EEPROM), or flash memory. Additionally, the components and/or devices disclosed herein can comprise, without being limited to comprising, these and any other suitable types of memory.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Aspects of systems, apparatus, devices, processes, and process blocks explained herein can be embodied within hardware, such as an ASIC or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The above description of illustrated embodiments of the subject disclosure is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A sensor output digitizer, comprising:
a multiplexer stage configured to sequentially select sensor outputs from one or more sensors, resulting in a stream of selected sensor outputs;
a multi-stage analog to digital converter coupled with the multiplexer stage and configured to convert the stream of selected sensor outputs into a stream of digitized outputs, wherein the multi-stage analog to digital converter comprises:
a first stage comprising a sigma delta analog to digital converter, wherein the first stage converts the stream of selected sensor outputs into a first intermediate output and a second intermediate output; and
a second stage comprising a second analog to digital converter, wherein the second stage is coupled with the first intermediate output and converts the first intermediate output into a third intermediate output while the first stage continues to convert the stream of selected sensor outputs; and
a digital output combiner configured to re-scale and sum the second intermediate output and the third intermediate output to produce the stream of digitized sensor outputs.

2. The sensor output digitizer of claim 1, wherein the multiplexer stage comprises a multiplexer that sequentially selects the sensor outputs.

3. The sensor output digitizer of claim 2, wherein the multiplexer sequentially selects the sensor outputs according to a round-robin selection sequence.

4. The sensor output digitizer of claim 2, wherein the multiplexer stage further comprises a resettable amplifier coupled with the multiplexer, wherein the resettable amplifier is configured to reset upon selection of a sensor output.

5. The sensor output digitizer of claim 4, wherein the multiplexer stage further comprises a demodulator coupled between the resettable amplifier and the multi-stage analog to digital converter.

6. The sensor output digitizer of claim 1, wherein the sigma delta analog to digital converter is a first order sigma delta analog to digital converter.

7. The sensor output digitizer of claim 1, wherein the second analog to digital converter comprises a successive approximation register.

8. The sensor output digitizer of claim 7, wherein the successive approximation register is an eleven bit successive approximation register.

9. The sensor output digitizer of claim 1, wherein the first intermediate output comprises a residual voltage of the sigma delta analog to digital converter.

10. The sensor output digitizer of claim 1, further comprising an accumulator coupled between the second intermediate output from the sigma delta analog to digital converter and the digital output combiner.

11. The sensor output digitizer of claim 1, wherein the one or more sensors comprise a micro electro-mechanical system (MEMS) sensor.

12. The sensor output digitizer of claim 1, further comprising a clocked drive circuit that triggers sequential selection of sensor outputs by the multiplexer stage.

13. A method to digitize sensor outputs from one or more sensors, comprising:
selecting sensor outputs in a sequential selection sequence, resulting in a stream of selected sensor outputs;
using a multi-stage analog to digital converter to convert the stream of selected sensor outputs into a stream of digitized outputs, wherein the using the multi-stage analog to digital converter comprises:
using a sigma delta analog to digital converter to convert the stream of selected sensor outputs into a first intermediate output and a second intermediate output; and
using a second analog to digital converter to convert the first intermediate output into a third intermediate output while the multi-stage analog to digital converter continues to use the sigma delta analog to digital converter to convert the stream of selected sensor outputs; and
re-scaling and summing the second intermediate output and the third intermediate output to produce the stream of digitized sensor outputs.

14. The method to digitize sensor outputs from one or more sensors of claim 13, wherein the sequential selection sequence is a round-robin selection sequence.

15. The method to digitize sensor outputs from one or more sensors of claim 13, further comprising amplifying the stream of selected sensor outputs prior to using the multi-stage analog to digital converter to convert the stream of selected sensor outputs into the stream of digitized outputs.

16. The method to digitize sensor outputs from one or more sensors of claim 15, further comprising resetting, upon selection of a sensor output, an amplifier used to amplify the stream of selected sensor outputs.

17. The method to digitize sensor outputs from one or more sensors of claim 16, further comprising, after amplifying the stream of selected sensor outputs, demodulating the stream of selected sensor outputs prior to using the multi-stage analog to digital converter to convert the stream of selected sensor outputs into the stream of digitized outputs.

18. The method to digitize sensor outputs from one or more sensors of claim 13, wherein the sigma delta analog to digital converter is a first order sigma delta analog to digital converter.

19. The method to digitize sensor outputs from one or more sensors of claim 13, wherein the second analog to digital converter comprises a successive approximation register.

20. The method to digitize sensor outputs from one or more sensors of claim 13, further comprising accumulating the second intermediate output for use in re-scaling and summing the second intermediate output and the third intermediate output to produce the stream of digitized sensor outputs.

21. The method to digitize sensor outputs from one or more sensors of claim 13, wherein the sensor outputs comprise outputs from a micro electro-mechanical system (MEMS) sensor.

22. The method to digitize sensor outputs from one or more sensors of claim 13, further comprising triggering the selecting sensor outputs in the sequential selection sequence using a clocked drive circuit.

\* \* \* \* \*